(12) United States Patent
She et al.

(10) Patent No.: US 10,892,087 B1
(45) Date of Patent: Jan. 12, 2021

(54) ON-CHIP INDUCTORS

(71) Applicant: Marvell International Ltd., Hamilton (BM)

(72) Inventors: Min She, Fremont, CA (US); Zhendong Guo, San Jose, CA (US)

(73) Assignee: MARVELL ASIA PTE, LTD., Singapore (SG)

( * ) Notice: Subject to any disclaimer, the term of this patent is extended or adjusted under 35 U.S.C. 154(b) by 0 days.

(21) Appl. No.: 16/159,334

(22) Filed: Oct. 12, 2018

Related U.S. Application Data (60) Provisional application No. 62/572,301, filed on Oct. 13, 2017.

(51) Int. Cl.
*H01F 27/28* (2006.01)
*H01L 23/522* (2006.01)
*H01L 23/528* (2006.01)
*H01L 23/64* (2006.01)
*H01L 49/02* (2006.01)

(52) U.S. Cl.
CPC ..... *H01F 27/2804* (2013.01); *H01F 27/2828* (2013.01); *H01L 23/528* (2013.01); *H01L 23/5226* (2013.01); *H01L 23/5227* (2013.01); *H01L 23/645* (2013.01); *H01L 28/10* (2013.01)

(58) Field of Classification Search
CPC ............ H01F 27/2804; H01F 27/2828; H01L 23/5226; H01L 53/5227; H01L 23/528; H01L 23/645; H01L 28/10
USPC .......................................................... 257/531
See application file for complete search history.

(56) References Cited

U.S. PATENT DOCUMENTS

| | | | |
|---|---|---|---|
| 2004/0195651 A1* | 10/2004 | Zhang ................ | H01F 17/0006 257/531 |
| 2008/0180204 A1* | 7/2008 | Noire .................. | H01F 17/0013 336/173 |

OTHER PUBLICATIONS

Reference: "Differentially Driven Symmetric Microstrip Inductors", IEEE Transactions on Microwave Theory and Techniques, vol. 50, No. 1, Jan. 2002, p. 1-10.

* cited by examiner

*Primary Examiner* — Tong-Ho Kim (57) ABSTRACT

Aspects of the disclosure provide an integrated circuit (IC) chip with an on-chip transformer. The on-chip transformer includes a primary inductor and a secondary inductor. The primary inductor is configured to have a first-primary coil portion formed of a first patterned metal trace disposed in a first metal layer and a second-primary coil portion formed of a second patterned metal trace disposed in a second metal layer. The secondary inductor is configured to have a first-secondary coil portion formed of a third patterned metal trace that interleaves with the first patterned metal trace in the first metal layer and a second-secondary coil portion formed of a fourth patterned metal trace that interleaves with the second patterned metal trace in the second metal layer.

18 Claims, 5 Drawing Sheets

ON-CHIP INDUCTORS

INCORPORATION BY REFERENCE

This present disclosure claims the benefit of U.S. Provisional Application No. 62/572,301, "AN AREA EFFICIENT AND SIMPLE LAYOUT OF A TRANSFORMER" filed on Oct. 13, 2017, which is incorporated herein by reference in its entirety.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Inductors are used in various circuits. In an example, an LC-tank based voltage controlled oscillator includes an inductor and a capacitor coupled together to form an LC tank. In another example, a transformer includes a primary inductor and a secondary inductor coupled together to transfer energy.

SUMMARY

Aspects of the disclosure provide an integrated circuit (IC) chip with an on-chip transformer. The on-chip transformer includes a primary inductor and a secondary inductor. the primary inductor is configured to have a first-primary coil portion formed of a first patterned metal trace disposed in a first metal layer and a second-primary coil portion formed of a second patterned metal trace disposed in a second metal layer. The secondary inductor is configured to have a first-secondary coil portion formed of a third patterned metal trace that interleaves with the first patterned metal trace in the first metal layer and a second-secondary coil portion formed of a fourth patterned metal trace that interleaves with the second patterned metal trace in the second metal layer.

In an example, the IC chip includes a first via structure configured to connect the first-primary coil portion formed of the first patterned metal trace in the first metal layer with the second-primary coil portion formed of the second patterned metal trace in the second metal layer. Further, the IC chip includes a second via structure configured to connect the first-secondary coil portion formed of the third patterned metal trace in the first metal layer with the second-secondary coil portion formed of the fourth patterned metal trace in the second metal layer.

In an embodiment, the first patterned metal trace and the third patterned metal trace interleave and spiral toward a center point in a first direction, and the second patterned metal trace and the fourth patterned metal trace interleave and spiral away from the center point in the first direction.

In some embodiments, the primary inductor is configured to have a third-primary coil portion formed of a fifth patterned metal trace disposed in a third metal layer and the secondary inductor is configured to have a third-secondary coil portion formed of a sixth patterned metal trace that interleaves with the fifth patterned metal trace in the third metal layer.

In some examples, the first-primary coil portion and the first-secondary coil portion occupy a first area, and the second-primary coil portion and the second-secondary coil portion occupy a second area that is located in vertical alignment overlaying the first area.

In an example, the first-primary coil portion has a first pattern and the second-primary coil portion has a second pattern that is reflectionally symmetric to the first pattern with reference to a center line of first pattern and the second pattern.

In another example, the first-primary coil portion has a first pattern, and the first-secondary coil portion has a second pattern that is rotationally symmetric to the first pattern with reference to a center point of the first pattern and the second pattern.

In an embodiment, a current flows in the primary inductor. The current flows in one of a clockwise direction and a counter clockwise direction in both the first-primary coil portion and the second-primary coil portion. In some example, the primary inductor includes a first terminal formed in the first patterned metal trace, and a second terminal formed in the second patterned metal trace. In another embodiment, the first terminal is formed at an outer end of the first patterned metal trace, the second terminal is formed at an outer end of the second patterned metal trace, and the first via structure is configured to connect an inner end of the first patterned metal trace in the first metal layer with an inner end of the second patterned metal trace in the second metal layer.

Aspects of the disclosure provide a method of forming a transformer on an integrated circuit (IC) chip. The method includes forming a first-primary coil portion of a primary inductor and a first-secondary coil portion of a secondary inductor as first interleaved spirals of a first metal layer, and forming a second-primary coil portion of the primary inductor and a second-secondary coil portion of the secondary inductor as second interleaved spirals of a second metal layer.

Aspects of the disclosure provide an electronic device having an integrated circuit (IC) chip with an on-chip transformer. The on-chip transformer includes a primary inductor and a secondary inductor. the primary inductor is configured to have a first-primary coil portion formed of a first patterned metal trace disposed in a first metal layer and a second-primary coil portion formed of a second patterned metal trace disposed in a second metal layer. The secondary inductor is configured to have a first-secondary coil portion formed of a third patterned metal trace that interleaves with the first patterned metal trace in the first metal layer and a second-secondary coil portion formed of a fourth patterned metal trace that interleaves with the second patterned metal trace in the second metal layer.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Aspects of the disclosure provide an integrated circuit (IC) chip with coupled on-chip inductive elements that are formed of interleaved spiral traces in multiple metal layers. In an embodiment, the IC chip includes a transformer formed of a primary inductor and a secondary inductor coupled together. The primary inductor and the secondary inductor are formed of interleaved spiral traces in multiple metal layers, in an embodiment. In another embodiment, the IC chip includes a pair of inductors that is driven by differential circuits. The pair of inductors is formed of interleaved spiral traces in multiple metal layers. For simplicity, the pair of inductors that is driven by the differential circuits is also referred to as a primary inductor and a secondary inductor. Thus, while transformer is used as context in specific examples of the present disclosure, the disclosed techniques in the specific examples can be used in a pair of inductors that is driven by differential circuits in other examples.

Figure 1:
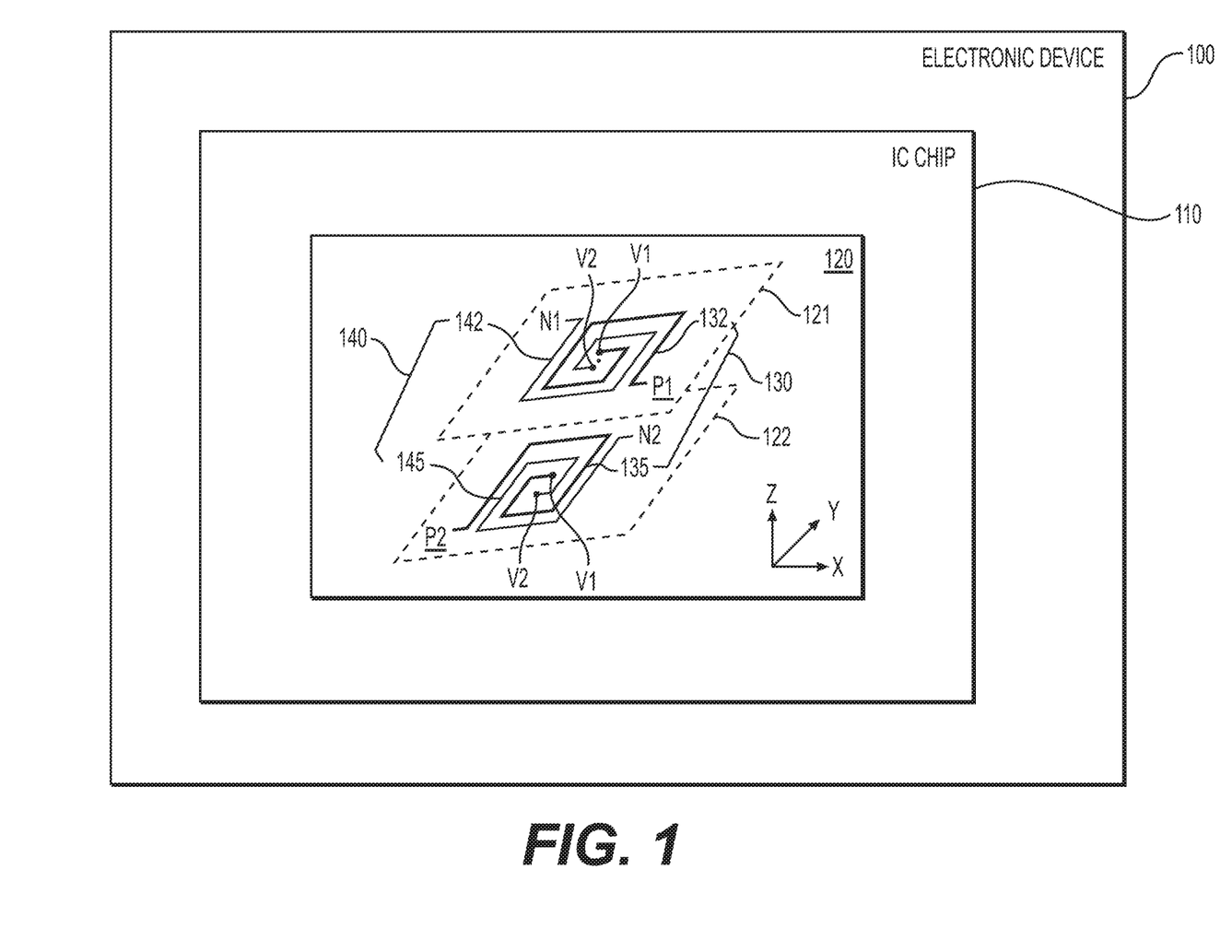
FIG. 1 shows a block diagram of an electronic device 100 having coupled on-chip inductors 130 and 140 according to an embodiment of the disclosure.

FIG. 1 shows a block diagram of an electronic device 100 having coupled on-chip inductive elements according to an embodiment of the disclosure. The coupled on-chip inductive elements are formed of interleaved spiral traces in multiple metal layers. Specifically, in the FIG. 1 example, the electronic device 100 includes an integrated circuit (IC) chip 110, and a transformer 120 that is implemented on the IC chip 110. The transformer 120 includes a primary inductor 130 and a secondary inductor 140 that are formed of interleaved spiral traces in multiple metal layers.

The electronic device 100 can be any suitable device, such as a desktop computer, a laptop computer, a tablet computer, a smart phone, a network switch, an access point, a router, a set-top box, a television, and the like, that includes an on-chip transformer. In an embodiment, the IC chip 110 is configured to have multiple DC voltage domains. For example, the IC chip 110 includes first circuitry that operates in a first voltage domain, such as a relatively high voltage (e.g., 12V, 5V, . . . ) domain, and second circuitry that operates in a second voltage domain, such as a relatively low (e.g., 3V, 1.5V, . . . ) voltage domain. The transformer 120 isolates the second circuitry from the first circuitry electrically. For example, the first circuitry is connected with the primary inductor 130, and the second circuitry is connected with the secondary inductor 140. In an example, the first voltage domain and the second voltage domain have different supply rails. Thus, the second low voltage circuitry is protected from electrical shock or over-voltage hazard caused by operation of the first high voltage circuitry.

It is noted that, in another embodiment, the primary inductor 130 and the secondary inductor 140 are driven by differential circuits.

According to an aspect of the disclosure, the primary inductor 130 and the secondary inductor 140 are formed of interleaved spiral traces that are formed as metallic patterns disposed on two or more layers of an integrated circuit 110. These layers may be referred to herein as metal layers, which typically are formed by depositing a metal on a substrate. In an example, a first inductor portion 132 of the primary inductor 130 is disposed on the IC chip 110 as a first metal layer 121 while a second inductor portion 135 of the primary inductor 130 is disposed on the IC chip 110 as second metal layer 122. A first inductor portion 142 of the secondary inductor 140 is also disposed on the IC chip 110 in the first metal layer 121 while a second inductor portion 145 of the secondary inductor 140 is also disposed on the IC chip 110 in the second metal layer 122 of IC chip 110. In this disclosure the first inductor portion 132 of the primary inductor 130 is also referred to at times as first-primary coil portion, while the second inductor portion 135 is also referred to at times as second-primary coil portion. Similarly, the first inductor portion 142 of the secondary inductor 140 is also referred to at times as first-secondary coil portion, while the second inductor portion 145 is also referred to at times as second-secondary coil portion.

In the embodiment seen in FIG. 1, a via structure V1 is formed to connect the first inductor portion 132 and the second inductor portion 135 to form the primary inductor 130. The primary inductor 130 has a first terminal P1 in the first metal layer 121 and a second terminal P2 in the second metal layer 122. In an example, the first circuitry is connected to the primary inductor 130 via the first terminal P1 and the second terminal P2.

Similarly, in the embodiment seen in FIG. 1, a via structure V2 is formed to connect the first inductor portion 142 and the second inductor portion 145 to form the secondary inductor 140. The secondary inductor 140 has a first terminal N1 in the first metal layer 121 and a second terminal N2 in the second metal layer 122. In an example, the second circuitry is connected to the secondary inductor 140 via the first terminal N1 and the second terminal N2.

In addition, in the FIG. 1 example, the first inductor portion 132 of the primary inductor 130 and the first inductor portion 142 of the secondary inductor 140 have spiral patterns and are interleaved in the first metal layer 121. The second inductor portion 135 of the primary inductor 130 and the second inductor portion 145 of the secondary inductor 140 have spiral patterns and are interleaved in the second metal layer 122. The spiral patterns can have any suitable spiral shape, such as circular spiral, square spiral, hexagonal spiral, octagonal spiral, and the like. In the present disclosure, the square spirals are used as examples, the disclosed techniques can be used with other spiral shape, such as the circular spiral, hexagonal spiral, octagonal spiral, and the like. Additionally, in some embodiments, the respective spiral patterns of inductors 130 and 140 each have a lesser number or greater number of windings than as seen in the figures.

Further according to an embodiment of the disclosure, the two portions of an inductor in the respective two metal layers seen in FIG. 1 are interconnected by a via structure with two terminals respectively in the two metal layers. The two portions, for example, from a first terminal in a first metal layer to the via structure and from the via structure to a second terminal in a second metal layer, are configured to revolve in the same direction. For example, the first inductor portion 132 of the primary inductor 130 revolves in a counter clockwise direction toward a center of the spiral pattern of the first inductor portion 132, from the first terminal P1 to the via structure V1, and the second inductor portion 135 of the primary inductor 130 similarly revolves in the counter clockwise direction away from a center of the spiral pattern of the second inductor portion 135, from the via structure V1 to the second terminal P2. Thus, current flows in the primary inductor 130 from the first terminal P1 through via V1 to the second portion P2 in an uninterrupted counter clockwise direction. Thus, the current flows through the first inductor portion 132 and the second inductor portion 135 in the same direction, and causes magnetic field in the same direction.

Similarly, the first inductor portion 142 of the secondary inductor 140 revolves in a counter clockwise direction toward a center of the spiral pattern of the first inductor portion 142, from the first terminal N1 to the via structure V2, and the second inductor portion 145 of the secondary inductor 140 revolves in the counter clockwise direction away from the center of the spiral pattern of the second inductor portion 145, from the via structure V2 to the second terminal N2. Thus, in an example, due to the magnetic field caused by the primary inductor 130, current generated in the first inductor portion 142 and current generated in the second inductor portion 145 flow in the same direction. For example, when the current generated in the first inductor portion 142 flows in a direction from the first terminal N1 to the via structure V2, the current generated in the second inductor portion 145 flows in a direction from the via structure V2 to the second terminal N2. It is noted that, depending on changes of the magnetic field, when the current generated in the first inductor portion 142 flows in a direction from the via structure V2 to the first terminal N1, the current generated in the second inductor portion 145 flows in a direction from the second terminal N2 to the via structure V2.

According to an aspect of the disclosure, the first inductor portion 132 of the primary inductor 130 and the first inductor portion 142 of the secondary inductor 140 occupy a first area, and the second inductor portion 135 of the primary inductor 130 and the second inductor portion 145 of the secondary inductor 140 occupy a second area. In an example, the first area aligns with the second area in a vertical direction (e.g., Z axis), and the first area (also the second area) is used in the first metal layer 121 and the second metal layer 122 to form the primary inductor 130 and the secondary inductor 140.

In a conventional example that also uses two metal layers, respective primary and secondary coils of the inductors are formed in a first metal layer, and a second metal layer is used for forming underpasses that interconnect the respective primary and secondary coils. Compared to the conventional example, the transformer 120 in FIG. 1 achieves higher inductance per unit area because both the first metal layer 121 and the second metal layer 122 are used for forming the primary inductor 130 and the secondary inductor 140, and the two coils formed to vertically overlap each other thereby providing a similar inductance however with a smaller form factor.

According to another aspect of the disclosure, compared to the conventional example, a reduced number of via structures are required for the inductor configuration seen in the FIG. 1 example. In the conventional example, each 360° spiral turn needs two underpasses, and thus needs four via structures. Such via structures typically require increased area and add resistance to the coil winding. In the FIG. 1 example, however, a total of two via structures are used irrespective of the number of spiral turns. When the number of via structures is reduced, the resistance of the coil winding is reduced. The resistance reduction in the coil winding improves Q factor (Q factor being indicative of energy loss) of the transformer 120 relative to the conventional example.

In the FIG. 1 example, the first metal layer 121 and the second metal layer 122 are used as an example. Additional overlying metal layers can be used to form the transformer 120, and thereby further increase inductance per unit area in some embodiments.

Figure 2:
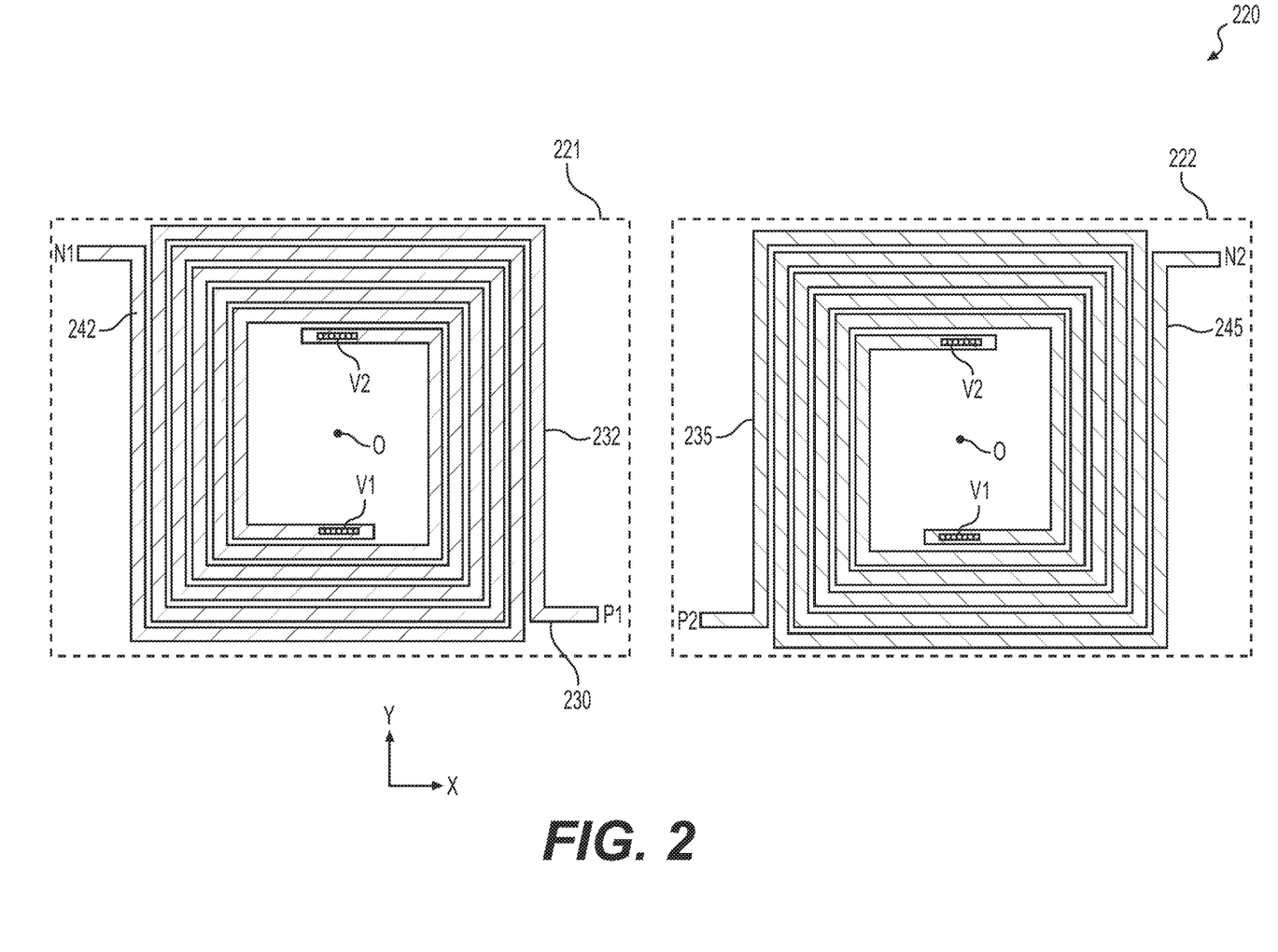
FIG. 2 shows a layout for coupled on-chip inductors 130 and 140 according to an embodiment of the disclosure.

FIG. 2 shows a layout 220 of coupled on-chip inductors according to an embodiment of the disclosure. In an example, the layout 220 is used to fabricate the transformer 120 on the IC chip 110.

The layout 220 includes a first layout layer 221 and a second layout layer 222. During fabrication of the IC chip 110, the first layout layer 221 is aligned as a vertical overlay layer respective of the second layout layer 222 to form the transformer 120, in an embodiment, despite being depicted in the FIG. 2 side-by-side. In an example, the first layout layer 221 defines structures in the first metal layer 121, and the second layout layer 222 defines structures in the second metal layer 122 of FIG. 1. For example, the first layout layer 221 includes a pattern 232 that defines a spiral pattern for the first inductor portion 132 of the primary inductor 130, and includes a pattern 242 that defines a spiral pattern for the first inductor portion 142 of the secondary inductor 140. The second layout layer 222 includes a pattern 235 that defines a spiral pattern for the second inductor portion 135 of the primary inductor 130, and includes a pattern 245 that defines a spiral pattern for the second inductor portion 145 of the secondary inductor 140.

In the FIG. 2 example, a via layout layer with via structure patterns are respectively overlaid on the first layout layer 221 and the second layout layer 222 to indicate the positions for via structures V1 and V2. During fabrication of the IC chip 110, the via layout layer is used to form the via structures V1 and V2 for example by means of dielectric deposition, dielectric etching using the via layout layer, metal deposition and etching-back.

In the FIG. 2 example, the pattern 232 and the pattern 235 are reflectionally symmetric (or mirror symmetric) to each other, with the line of symmetry being parallel to the Y-axis and passing a spiral center point O. Similarly, the pattern 242 and the pattern 245 are reflectionally symmetric, with the line of symmetry being parallel to the Y-axis and passing the spiral center point O.

In the FIG. 2 example, the pattern 232 and the pattern 242 are rotationally symmetric with regard to the spiral center point O. For example, when the pattern 232 rotates 180° with regard to the spiral center point O, the rotated pattern 232 overlaps the pattern 242. The pattern 232 and the pattern 242 are interleaved in the first layout layer 221. In the FIG. 2 example, the pattern 232 and the pattern 242 are of the same width. In another example, the pattern 232 and the pattern 242 have different widths.

The pattern 235 and the pattern 245 are rotationally symmetric with regard to the spiral center point O. For example, when the pattern 235 rotates 180° with regard to the spiral center point O, the rotated pattern 235 overlaps the pattern 245. The pattern 235 and the pattern 245 are interleaved in the second layout layer 222. In the FIG. 2 example, the pattern 235 and the pattern 245 are of the same width. In another example, the pattern 235 and the pattern 245 have different widths.

In an example, the second layout layer 222 is used to define spiral structures in an area of the second metal layer 122 (e.g., a lower metal layer). Then, via structures are formed to connect with the spiral structures of the second metal layer 122. The first layout layer 221 is used to define spiral structures in the same area of the first metal layer 121 (e.g., an upper metal layer). When the patterns are vertically aligned in the second metal layer 122, the via connection layer and the first metal layer 121 during fabrication, the via structures V1 and V2 are formed to electrically connect the spiral structures in the first metal layer 121 with the spiral structures in the second metal layer 122.

Further according to an embodiment of the disclosure, the patterns that respectively define two portions of an inductor in the two metal layers revolve in the same direction when the patterns are interconnected at the position of the via structure, thus when a current flows in the inductor, the two portions of the inductor can generate magnetic field in the same direction. For example, the pattern 232 revolves in a counter clockwise direction from a first terminal P1 location to the via structure V1 location, and the pattern 235 revolves in the counter clockwise direction from the via structure V1 location to a second terminal P2 location.

Figure 3:
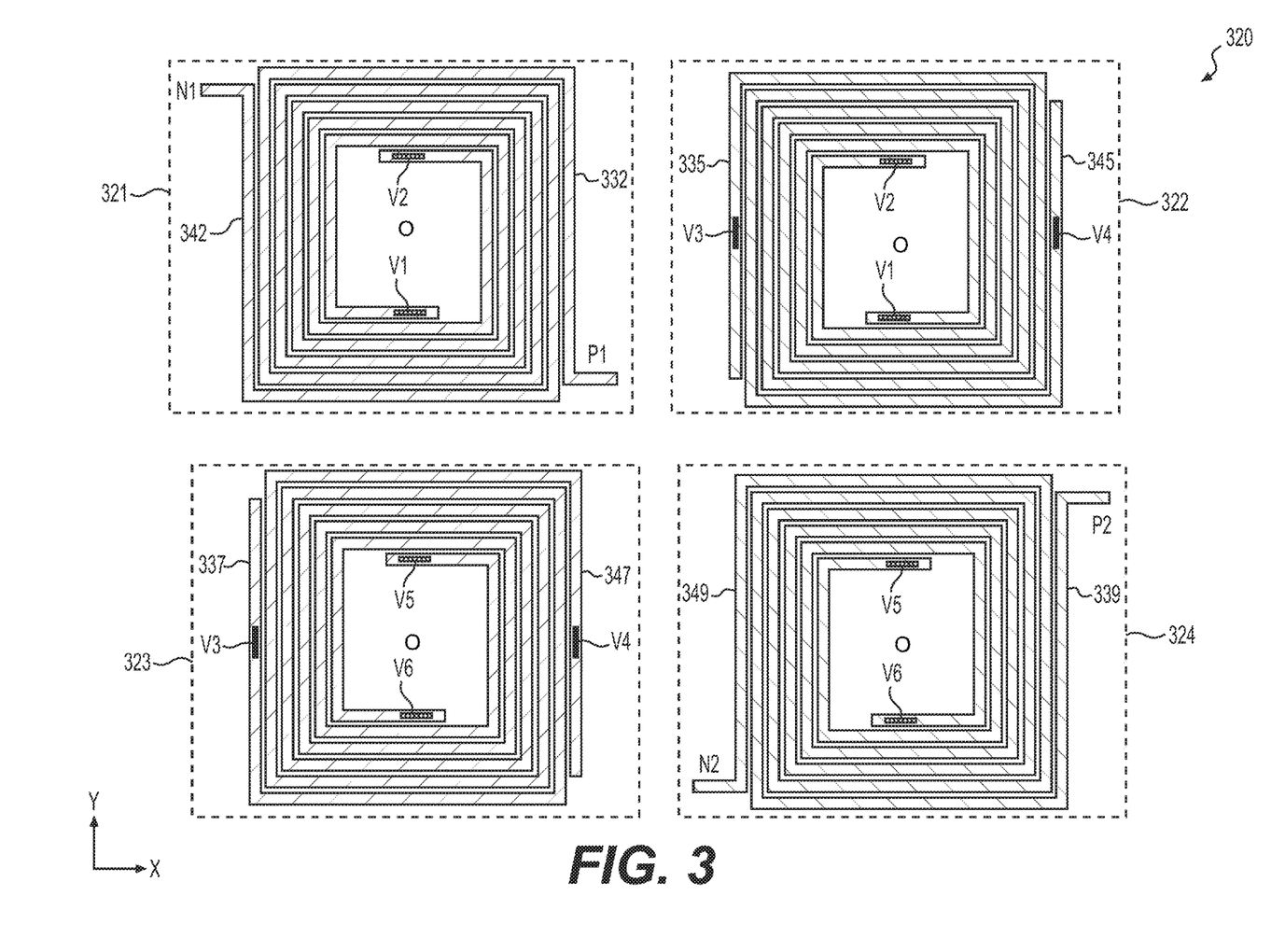
FIG. 3 shows another layout of coupled on-chip inductors 130 and 140 according to an embodiment of the disclosure.

FIG. 3 shows a layout 320 of coupled on-chip inductors according to an embodiment of the disclosure. In an example, multiple layers of layout 320 are used to fabricate the transformer 120 on the IC chip 110.

The layout 320 includes a first layout layer 321, a second layout layer 322, a third layout layer 323, and a fourth layout layer 324. In an example, the first layout layer 321 defines structures in the first metal layer 121, the second layout layer 322 defines structures in the second metal layer 122, the third layout layer 323 defines structures in a third metal layer (not shown in FIG. 1), and the fourth layout layer 324 defines structures in a fourth metal layer (not shown in FIG. 1). During fabrication of the IC chip 110, the first layout layer 321, the second layout layer 322, the third layout layer 323 and the fourth layout layer 324 are aligned vertically to form the transformer 120, in an embodiment, despite being depicted in the FIG. 3 side-by-side.

For example, the first layout layer 321 includes a pattern 332 that defines a spiral pattern for the first inductor portion 132 of the primary inductor 130, and includes a pattern 342 that defines a spiral pattern for the first inductor portion 142 of the secondary inductor 140. The second layout layer 322 includes a pattern 335 that defines a spiral pattern for the second inductor portion 135 of the primary inductor 130, and includes a pattern 345 that defines a spiral pattern for the second inductor portion 145 of the secondary inductor 140.

The third layout layer 323 includes a pattern 337 that defines a spiral pattern for a third portion (not shown in FIG. 1) of the primary inductor 130, and includes a pattern 347 that defines a spiral pattern for a third portion (not shown in FIG. 1) of the secondary inductor 140. The fourth layout layer 324 includes a pattern 339 that defines a spiral pattern for a fourth portion (not shown in FIG. 1) of the primary inductor 130, and includes a pattern 349 that defines a spiral pattern for a fourth portion (not shown in FIG. 1) of the secondary inductor 140.

In the FIG. 3 example, a first via layout layer with via structure patterns are overlaid respectively on the first layout layer 321 and the second layout layer 322 to indicate the locations for positioning via structures V1 and V2; a second via layout layer with via structure patterns are overlaid respectively on the second layout layer 322 and the third layout layer 323 to indicate the locations for positioning via structures V3 and V4; and a third via layout layer with via structure patterns are overlaid respectively on the third layout layer 323 and the fourth layout layer 324 to indicate the locations for positioning via connections V5 and V6. During fabrication of the IC chip 110, the via layout layers are used to form the via structures. For example, the via structures V1 and V2 are formed by means of dielectric deposition, dielectric etching using the first via layout layer, metal deposition and etching-back. The via structures V3 and V4 are formed by means of dielectric deposition, dielectric etching using the second via layout layer, metal deposition and etching-back. The via structures V5 and V6 are formed by means of dielectric deposition, dielectric etching using the third via layout layer, metal deposition and etching-back.

In the FIG. 3 example, the pattern 332 and the pattern 335 are reflectionally symmetric (or mirror symmetric) to each other except a terminal P1, and the line of symmetry is parallel to the Y-axis and passes the center point O of the spiral pattern; the pattern 342 and the pattern 345 are reflectionally symmetric except a terminal N1, and the line of symmetry is parallel to the Y-axis and passes the center point O of the spiral pattern. Further, the pattern 335 and the pattern 337 are reflectionally symmetric (or mirror symmetric) to each other with the line of symmetry being parallel to the X-axis and passing the center point O of the spiral pattern; the pattern 345 and the pattern 347 are reflectionally symmetric with the line of symmetry being parallel to the X-axis and passing the center point O of the spiral pattern. The pattern 337 and the pattern 339 are reflectionally symmetric (or mirror symmetric) to each other except a terminal P2, and the line of symmetry is parallel to the Y-axis and passes the center point O of the spiral pattern; the pattern 347 and the pattern 349 are reflectionally symmetric except a terminal N2, and the line of symmetry is parallel to the Y-axis and passes the center point O of the spiral pattern.

In the FIG. 3 example, the pattern 332 and the pattern 342 are rotationally symmetric with regard to the spiral center point O. The pattern 335 and the pattern 345 are rotationally symmetric with regard to the spiral center point O. The pattern 337 and the pattern 347 are rotational symmetric with regard to the spiral center point O. The pattern 339 and the pattern 349 are rotational symmetric with regard to the spiral center point O. In the FIG. 3 example, the patterns on the layout layers are of the same width. In another example, the patterns on the layout layers have different widths.

In an embodiment, the layout 320 is used to pattern four metal layers respectively according to the layout layers 321-324, and to form via structures to connect the spiral metal traces in the four metal layers to form a transformer that includes a primary inductor and a secondary inductor. For example, the primary inductor includes a first spiral metal trace defined by the pattern 332, a via structure V1, a second spiral metal trace defined by the pattern 335, a via structure V3, a third spiral metal trace defined by the pattern 337, a via structure V5, and the fourth spiral metal trace defined by the pattern 339. Thus, the first spiral metal trace revolves in a counter clockwise direction from the terminal P1 to the via structure V1, and the second spiral metal trace revolves in the counter clockwise direction from the via structure V1 to the via structure V3, the third spiral metal trace revolves in the counter clockwise direction from the via structure V3 to the via structure V5, and the fourth spiral metal trace revolves in the counter clockwise direction from the via structure V5 to the terminal P2. Then, when a current flows in the primary inductor, the four spiral metal traces in the four metal layers generate magnetic field in the same direction.

Similarly, the secondary inductor includes a first spiral metal trace defined by the pattern 342, a via structure V2, a second spiral metal trace defined by the pattern 345, a via structure V4, a third spiral metal trace defined by the pattern 347, a via structure V6, and the fourth spiral metal trace defined by the pattern 349. Thus, the first spiral metal trace revolves in a counter clockwise direction from the terminal N1 to the via structure V2, and the second spiral metal trace revolves in the counter clockwise direction from the via structure V2 to the via structure V4, the third spiral metal trace revolves in the counter clockwise direction from the via structure V4 to the via structure V6, and the fourth spiral metal trace revolves in the counter clockwise direction from the via structure V6 to the terminal N2. Then, when a magnetic field changes, the four spiral metal traces in the four metal layers generate current in the same direction.

It is noted that, while the layout 220 includes two metal layout layers to form a transformer, and the layout 320 includes four metal layout layers to form a transformer, transformers can be formed by any number of metal layers. For example, the two layout layers 322 and 323 can be repeated once to form a new layout (with layout layers 321, 322, 323, 322, 323, 324) to fabricate a transformer of six metal layers; the two middle layout layers 322 and 323 can be repeated twice to form a new layout (with layout layers 321, 322, 323, 322, 323, 322, 323, 324) to fabricate a transformer of eight metal layers. For other even number of metal layers, the two layout layers 322 and 323 can be repeated for a suitable number of times to form the new layout.

Additional, transformers can be formed by odd number of metal layers. For example, a transformer of three layers can be formed by using the layout layers 321, 322 and a modified layout layer 323. For example, in the modified layout layer 323, the via V5 location is then used for the terminal P2, and the via V6 location is then used for the terminal N2. Further, the two layout layers 322 and 323 can be repeated once to form a new layout (with layout layers 321, 322, 323, 322, modified layout layer 323) to fabricate a transformer of five metal layers. For other odd number of metal layers, the layout layers 322 and 323 can be repeated for a suitable number of times to form the new layout.

Accordingly, a transformer can be formed of any number of multiple metal layers. Each metal layer will include two spiral traces that are interleaved, one of the two spiral trace is a portion for the primary inductor and the other of the two spiral is a portion of the secondary inductor. Via structures are suitably used to connected portions of the primary inductor and the secondary inductors in the multiple metal layers to form the primary inductor and the secondary inductor of the transformer.

Figure 4:
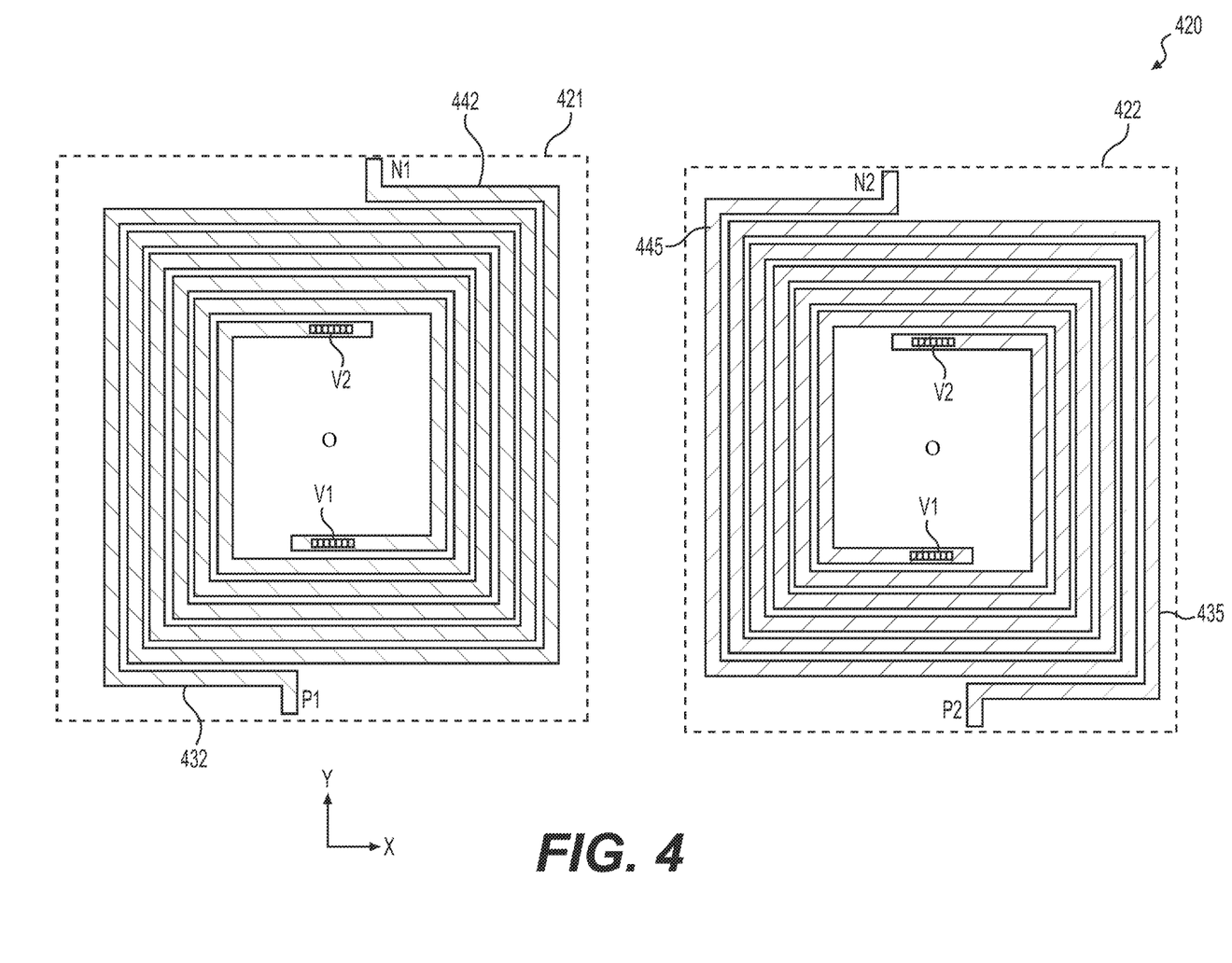
FIG. 4 shows another layout of coupled on-chip inductors 130 and 140 according to an embodiment of the disclosure.

FIG. 4 shows a layout 420 of coupled on-chip inductors according to an embodiment of the disclosure. In an example, the layout 420 is used to fabricate the transformer 120 on the IC chip 110.

The layout 420 is similar to the layer 220 except different terminal locations. For example, the terminals in the FIG. 2 example are located at the left and right sides of the square spirals in the X-Y plane, and the terminals in the FIG. 4 example are located at the top and bottom sides of the squire spirals in the X-Y plane.

Specifically, the layout 420 includes a first layout layer 421 and a second layout layer 422. During fabrication of the IC chip 110, the first layout layer 421 is aligned as a vertical overlay layer respective of the second layout layer 422 to form the transformer 120, in an embodiment, despite being depicted in the FIG. 4 side-by-side.

In an example, the first layout layer 421 defines structures in the first metal layer 121, and the second layout layer 422 defines structures in the second metal layer 122. For example, the first layout layer 421 includes a pattern 432 that defines a spiral pattern for the first inductor portion 132 of the primary inductor 130, and includes a pattern 442 that defines a spiral pattern for the first inductor portion 142 of the secondary inductor 140. The second layout layer 422 includes a pattern 435 that defines a spiral pattern for the second inductor portion 135 of the primary inductor 130, and includes a pattern 445 that defines a spiral pattern for the second inductor portion 145 of the secondary inductor 140.

In the FIG. 4 example, a via layout layer with via structure patterns are respectively overlaid on the first layout layer 421 and the second layout layer 422 to indicate the positions for via structures V1 and V2. During fabrication of the IC chip 110, the via layout layer is used to form the via structures V1 and V2 for example by means of dielectric deposition, dielectric etching using the via layout layer, metal deposition and etching-back.

In the FIG. 4 example, the pattern 432 and the pattern 435 are reflectionally symmetric (or mirror symmetric) to each other, and the line of symmetry is parallel to the Y-axis and passes the center O of the spiral pattern. Similarly, the pattern 442 and the pattern 445 are reflectionally symmetric, and the line of symmetry is parallel to the Y-axis and passes the center O of the spiral pattern.

In the FIG. 4 example, the pattern 432 and the pattern 442 are rotationally symmetric with regard to a spiral center point O. For example, when the pattern 432 rotates 180° with regard to the spiral center point O, the rotated pattern 432 overlaps the pattern 442. The pattern 432 and the pattern 442 are interleaved. The pattern 435 and the pattern 445 are rotationally symmetric with regard to the spiral center point O. For example, when the pattern 435 rotates 180° with regard to the spiral center point O, the rotated pattern 435 overlaps the pattern 445. The pattern 435 and the pattern 445 are interleaved. In the FIG. 4 example, the patterns on the layout layers are of the same width. In another example, the patterns on the layout layers have different widths.

In an example, the second layout layer 422 is used to define spiral structures in an area of the second metal layer 122 (e.g., a lower metal layer). Then, via structures are formed to connect with the spiral structures of the second metal layer 122. Then, the first layout layer 421 is used to define spiral structures in the same area of the first metal layer 121 (e.g., an upper metal layer). When the patterns are suitably aligned in the second metal layer 122, the via structure layer and the first metal layer 121, the via structures electrically connect the spiral structures in the first metal layer 121 with the spiral structures in the second metal layer 122.

Further according to an embodiment of the disclosure, the patterns that respectively define two portions of an inductor in the two metal layers revolve in the same direction when the patterns are interconnected at the position of the via structure, thus when a current flows in the inductor, the two portions of the inductor can generate magnetic field in the same direction. For example, the pattern 432 revolves in a clockwise direction from a first terminal P1 location to the via structure V1 location, and the pattern 435 revolves in the clockwise direction from the via structure V1 location to a second terminal P2 location.

Figure 5:
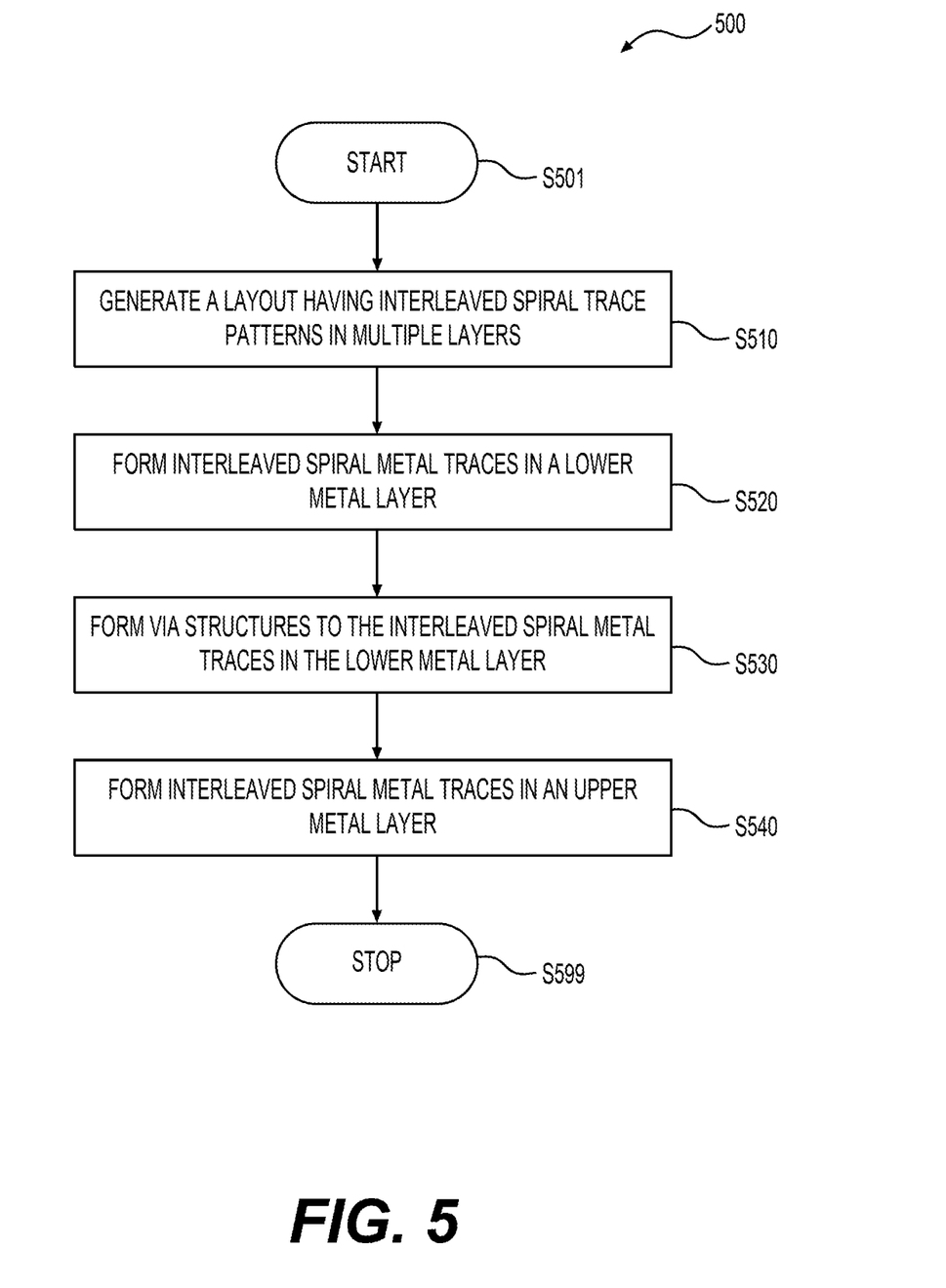
FIG. 5 shows a flow chart outlining a process example to fabricate the coupled on-chip inductors 130 and 140 according to an embodiment of the disclosure.

FIG. 5 shows a flow chart outlining a process example 500 to fabricate an IC chip with on-chip transformer, such as the IC chip 110, according to an embodiment of the disclosure. The process starts at S501 and proceeds to S510.

At S510, a layout for a transformer, such as the layout 220, the layout 320, the layout 420, and the like is generated. The layout includes interleaved spiral metal trace patterns in multiple layers that define patterns for portions of a primary inductor and a secondary inductor of the transformer in multiple metal layers of an IC chip. The layout also includes patterns that include locations for via structures that connect the interleaved spiral metal traces formed in the two or more layers as the primary inductor and the secondary inductor. A set of IC production masks is generated and subsequently used at a semiconductor fabrication facility to fabricate IC chips according to the layout design.

At S520, a lower metal layer is suitably patterned, for example using photolithography processes, to form interleaved spiral metal traces in the lower metal layer. For example, the second metal layer 122 is patterned according to the patterns 235 and 245 in the second layout layer 222 to form the second inductor portion 135 of the primary inductor 130, and the second inductor portion 145 of the secondary inductor 140.

At S530, via structures are formed. In an example, an insulating layer is deposited on the lower metal layer. The insulating layer is patterned according the via layout, for example, by means of photolithography process and etching process. Then, metal deposition is performed and etching back is performed to form the via structures. The via structures are connected with the interleaved spiral metal traces of the lower metal layer. For example, the via structure V1 is formed and connected with the second inductor portion 135 of the primary inductor 130, and the via structure V2 is formed and connected with the second inductor portion 145 of the secondary inductor 140.

At S540, an upper metal layer is patterned, using suitable fabrication processes such as photolithography, to form interleaved spiral metal traces of a metallic conductor in the upper metal layer according to the layout. For example, the first metal layer 121 is patterned according to the patterns 232 and 242 in the first layout layer 221 to form the first inductor portion 132 of the primary inductor 130, and the first inductor portion 142 of the secondary inductor 140. A via formed at location V1 connects the second inductor portion 135 with the first inductor portion 132 to form the primary inductor 130. A via structure formed at location V2 connects the second inductor portion 145 with the first inductor portion 142 to form the secondary inductor 140. In an embodiment, via structures s at locations V1 and V2 where previously formed in an intermediate insulating layers and inductor portions formed in the upper layer are electrically coupled to previously formed via structures. Then, the process proceeds to S599 and terminates.

It is noted that the process 500 includes additional suitable operations (not shown) before S520 and after S540 to fabricate IC chips.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An integrated circuit (IC) chip with an on-chip transformer, comprising:
    a primary inductor configured to have a first-primary coil portion formed of a first patterned metal trace disposed in a first metal layer and a second-primary coil portion formed of a second patterned metal trace disposed in a second metal layer;
    a secondary inductor configured to have a first-secondary coil portion formed of a third patterned metal trace that interleaves with the first patterned metal trace in the first metal layer and a second-secondary coil portion formed of a fourth patterned metal trace that interleaves with the second patterned metal trace in the second metal layer;
    a first via structure directly contacting the first-primary coil portion formed of the first patterned metal trace in the first metal layer and the second-primary coil portion formed of the second patterned metal trace in the second metal layer; and
    a second via structure directly contacting the first-secondary coil portion formed of the third patterned metal trace in the first metal layer and the second-secondary coil portion formed of the fourth patterned metal trace in the second metal layer.

2. The IC chip of claim 1, wherein the first patterned metal trace and the third patterned metal trace interleave and spiral toward a center point in a first direction, and the second patterned metal trace and the fourth patterned metal trace interleave and spiral away from the center point in the first direction.

3. The IC chip of claim 1, wherein:
    the primary inductor is configured to have a third-primary coil portion formed of a fifth patterned metal trace disposed in a third metal layer,
    the secondary inductor is configured to have a third-secondary coil portion formed of a sixth patterned metal trace that interleaves with the fifth patterned metal trace in the third metal layer.

4. The IC chip of claim 1, wherein the first-primary coil portion and the first-secondary coil portion occupy a first area, and the second-primary coil portion and the second-secondary coil portion occupy a second area that is located in vertical alignment overlaying the first area.

5. An integrated circuit (IC) chip with an on-chip transformer, comprising:
    a primary inductor configured to have a first-primary coil portion formed of a first patterned metal trace disposed in a first metal layer and a second-primary coil portion formed of a second patterned metal trace disposed in a second metal layer; and
    a secondary inductor configured to have a first-secondary coil portion formed of a third patterned metal trace that interleaves with the first patterned metal trace in the first metal layer and a second-secondary coil portion formed of a fourth patterned metal trace that interleaves with the second patterned metal trace in the second metal layer,
    wherein the first-primary coil portion has a first pattern and the second-primary coil portion has a second pattern that is reflectionally symmetric to the first pattern with reference to a center line of first pattern and the second pattern.

6. The IC chip of claim 1, wherein the first-primary coil portion has a first pattern, and the first-secondary coil portion has a second pattern that is rotationally symmetric to the first pattern with reference to a center point of the first pattern and the second pattern.

7. The IC chip of claim 1, wherein when a current flows in the primary inductor, the current flows in one of a clockwise direction and a counter clockwise direction in both the first-primary coil portion and the second-primary coil portion.

8. The IC chip of claim 1, wherein the primary inductor comprises a first terminal formed in the first patterned metal trace, and a second terminal formed in the second patterned metal trace.

9. The IC chip of claim 8, wherein the first terminal is formed at an outer end of the first patterned metal trace, the second terminal is formed at an outer end of the second patterned metal trace, and the first via structure is configured to connect an inner end of the first patterned metal trace in the first metal layer with an inner end of the second patterned metal trace in the second metal layer.

10. An electronic device having an integrated circuit (IC) chip with an on-chip transformer, the IC chip comprising:
a primary inductor configured to have a first-primary coil portion formed of a first patterned metal trace disposed in a first metal layer and a second-primary coil portion formed of a second patterned metal trace disposed in a second metal layer;
a secondary inductor configured to have a first-secondary coil portion formed of a third patterned metal trace that interleaves with the first patterned metal trace in the first metal layer and a second-secondary coil portion formed of a fourth patterned metal trace that interleaves with the second patterned metal trace in the second metal layer;
a first via structure directly contacting the first-primary coil portion formed of the first patterned metal trace in the first metal layer and the second-primary coil portion formed of the second patterned metal trace in the second metal layer; and
a second via structure directly contacting the first-secondary coil portion formed of the third patterned metal trace in the first metal layer and the second-secondary coil portion formed of the fourth patterned metal trace in the second metal layer.

11. The electronic device of claim 10, wherein the first patterned metal trace and the third patterned metal trace interleave and spiral toward a center point in a first direction, and the second patterned metal trace and the fourth patterned metal trace interleave and spiral away from the center point in the first direction.

12. The electronic device of claim 10, wherein:
the primary inductor is configured to have a third-primary coil portion formed of a fifth patterned metal trace disposed in a third metal layer,
the secondary inductor is configured to have a third-secondary coil portion formed of a sixth patterned metal trace that interleaves with the fifth patterned metal trace in the third metal layer.

13. The electronic device of claim 10, wherein the first-primary coil portion and the first-secondary coil portion occupy a first area, and the second-primary coil portion and the second-secondary coil portion occupy a second area that is located in vertical alignment overlaying the first area.

14. The electronic device of claim 10, wherein the first-primary coil portion has a first pattern, and the first-secondary coil portion has a second pattern that is rotationally symmetric to the first pattern with reference to a center point of the first pattern and the second pattern.

15. The electronic device of claim 10, wherein when a current flows in the primary inductor, the current flows in one of a clockwise direction and a counter clockwise direction in both the first-primary coil portion and the second-primary coil portion.

16. The electronic device of claim 10, wherein the primary inductor comprises a first terminal formed in the first patterned metal trace, and a second terminal formed in the second patterned metal trace.

17. The electronic device of claim 16, wherein the first terminal is formed at an outer end of the first patterned metal trace, the second terminal is formed at an outer end of the second patterned metal trace, and the first via structure is configured to connect an inner end of the first patterned metal trace in the first metal layer with an inner end of the second patterned metal trace in the second metal layer.

18. An electronic device having an integrated circuit (IC) chip with an on-chip transformer, the IC chip comprising:
a primary inductor configured to have a first-primary coil portion formed of a first patterned metal trace disposed in a first metal layer and a second-primary coil portion formed of a second patterned metal trace disposed in a second metal layer; and
a secondary inductor configured to have a first-secondary coil portion formed of a third patterned metal trace that interleaves with the first patterned metal trace in the first metal layer and a second-secondary coil portion formed of a fourth patterned metal trace that interleaves with the second patterned metal trace in the second metal layer,
wherein the first-primary coil portion has a first pattern and the second-primary coil portion has a second pattern that is reflectionally symmetric to the first pattern with reference to a center line of first pattern and the second pattern.

* * * * *